(12) United States Patent
McDavid et al.

(10) Patent No.: US 10,317,250 B2
(45) Date of Patent: Jun. 11, 2019

(54) DIRECT COUPLING OF A CAPACITIVE SENSOR TO A DELTA-SIGMA CONVERTER

(71) Applicant: ION Geophysical Corporation, Houston, TX (US)

(72) Inventors: William Terry McDavid, Richardson, TX (US); Lawrence Philip Behn, Houston, TX (US)

(73) Assignee: ION Geophysical Corporation, Houston, TX (US)

( * ) Notice: Subject to any disclaimer, the term of this patent is extended or adjusted under 35 U.S.C. 154(b) by 562 days.

(21) Appl. No.: 14/995,835

(22) Filed: Jan. 14, 2016

(65) Prior Publication Data

US 2016/0209243 A1 Jul. 21, 2016

Related U.S. Application Data

(60) Provisional application No. 62/104,202, filed on Jan. 16, 2015.

(51) Int. Cl.
*H03M 3/00* (2006.01)
*G01R 29/24* (2006.01)
*G01D 5/24* (2006.01)

(52) U.S. Cl.
CPC .............. *G01D 5/24* (2013.01); *H03M 3/434* (2013.01); *G01R 29/24* (2013.01)

(58) Field of Classification Search
CPC .......... G01D 5/24; H03M 3/434; G01R 29/24
USPC ............... 324/500, 600, 658, 425, 427, 519, 324/750.17, 754.28, 548, 661, 686, 76.11, 324/76.66; 320/162, 127, 141, 148, 164
See application file for complete search history.

(56) References Cited

U.S. PATENT DOCUMENTS

| 6,317,067 B1 * | 11/2001 | Mohindra ............... H03M 1/68 341/143 |
| 6,356,085 B1 | 3/2002 | Ryat et al. |
| 2003/0056597 A1 * | 3/2003 | Wang ........................ G01L 9/12 73/718 |
| 2007/0046299 A1 | 3/2007 | Hargreaves et al. |

(Continued)

OTHER PUBLICATIONS

International Search Report for International App. No. PCT/US2016/013532 dated Apr. 22, 2016, from the European Patent Office.

*Primary Examiner* — Melissa J Koval
*Assistant Examiner* — Trung Q. Nguyen
(74) *Attorney, Agent, or Firm* — Holland & Hart LLP

(57) ABSTRACT

Embodiments of an apparatus for direct coupling of a capacitive sensor to a delta-sigma converter are described. One apparatus includes a sensor, a charge coupling circuit configured to transfer at least a portion of charge generated by the sensor to an integrating circuit, a first charge feedback circuit configured to feed back charge to the sensor, a second charge feedback circuit configured to feed back charge to the integrating circuit, a comparing circuit configured to detect accumulated charge at the integrating circuit for a current cycle to determine a polarity of charge feedback for a subsequent cycle, and a logic circuit configured to provide a digital output corresponding to the sensed quantity and also configured to provide the polarity of charge feedback determined by the comparing circuit to the first charge feedback circuit and also to the second charge feedback circuit.

22 Claims, 6 Drawing Sheets

(56) References Cited

U.S. PATENT DOCUMENTS

2008/0061800 A1* 3/2008 Reynolds .......... G01R 27/2605
   324/678
2012/0229317 A1 9/2012 Carlsson et al.

* cited by examiner

DIRECT COUPLING OF A CAPACITIVE SENSOR TO A DELTA-SIGMA CONVERTER

CROSS REFERENCES

This application claims priority to and the benefit of U.S. provisional application No. 62/104,202, entitled, "DIRECT COUPLING OF A CAPACITIVE SENSOR TO A DELTA-SIGMA CONVERTER," which was filed on Jan. 16, 2015, and which is hereby incorporated by reference in its entirety for all purposes.

BACKGROUND OF THE INVENTION

The present disclosure generally relates to sensors and converters, and more particularly to methods and systems for directly coupling a capacitive sensor to a delta-sigma analog-to-digital converter.

Petrochemical products such as oil and gas are ubiquitous in society and can be found in everything from gasoline to children's toys. Because of this, the demand for oil and gas remains high. In order to meet this high demand, it is important to locate oil and gas reserves in the Earth. Scientists and engineers conduct "surveys" utilizing, among other things, seismic and other wave exploration techniques to find oil and gas reservoirs within the Earth. These seismic exploration techniques often include emitting seismic energy into the Earth with a seismic energy source (e.g., air guns, vibrators, dynamite, etc.), and monitoring the Earth's response to the seismic source with one or more receivers in order to create an image of the subsurface of the Earth.

The response of the Earth to the seismic energy is typically recorded at a plurality of receivers that may be, for example, towed behind an acquisition vessel in a marine survey, or positioned across a large swath of land in a land survey. Each receiver may include one or more sensors, including a particle motion sensor, a pressure sensor, or both a particle motion sensor and a pressure sensor in proximity to one another. The particle motion sensor may be, for example, a three-component geophone or accelerometer that records vectorial measurements of a reflected seismic wavefield. The pressure sensor may be, for example, a hydrophone that records scalar pressure measurements of the reflected seismic wavefield. By observing the reflected seismic wavefield detected by the receivers during the survey, geophysical data pertaining to the reflected signals may be acquired and this data may be used to form an image indicative of the subsurface near the survey location.

One type of particle motion sensor that may be used in a seismic survey is a capacitive piezoelectric sensor. Such a capacitive piezoelectric sensor may have a source impedance that is primarily capacitive, which may make it difficult to access a voltage on the sensor that is indicative of the motion sensed by the sensor.

DETAILED DESCRIPTION

Described herein are methods, apparatuses, and systems for coupling a sensor, such as a capacitive piezoelectric motion sensor, to an analog-to-digital converter, such as a delta-sigma ($\Delta\Sigma$) analog-to-digital converter. The sensor may be directly coupled to the $\Delta\Sigma$ converter in a charge-mode coupling approach to avoid thermal (Johnson) noise present in voltage-coupled arrangements due to the resistive feedback. A delta-sigma architecture may be used to implement the charge-mode coupling, in which packets of positive or negative charge are fed back to the sensor to counteract or negate the charge generated by the sensor. By measuring the amounts of charge that are fed back to the sensor to counteract or negate the charge generated by the sensor, the charge generated by the sensor can be quantized, and a digital output proportional to the charge generated by the sensor can be provided at the output of the $\Delta\Sigma$ converter.

Figure 1:
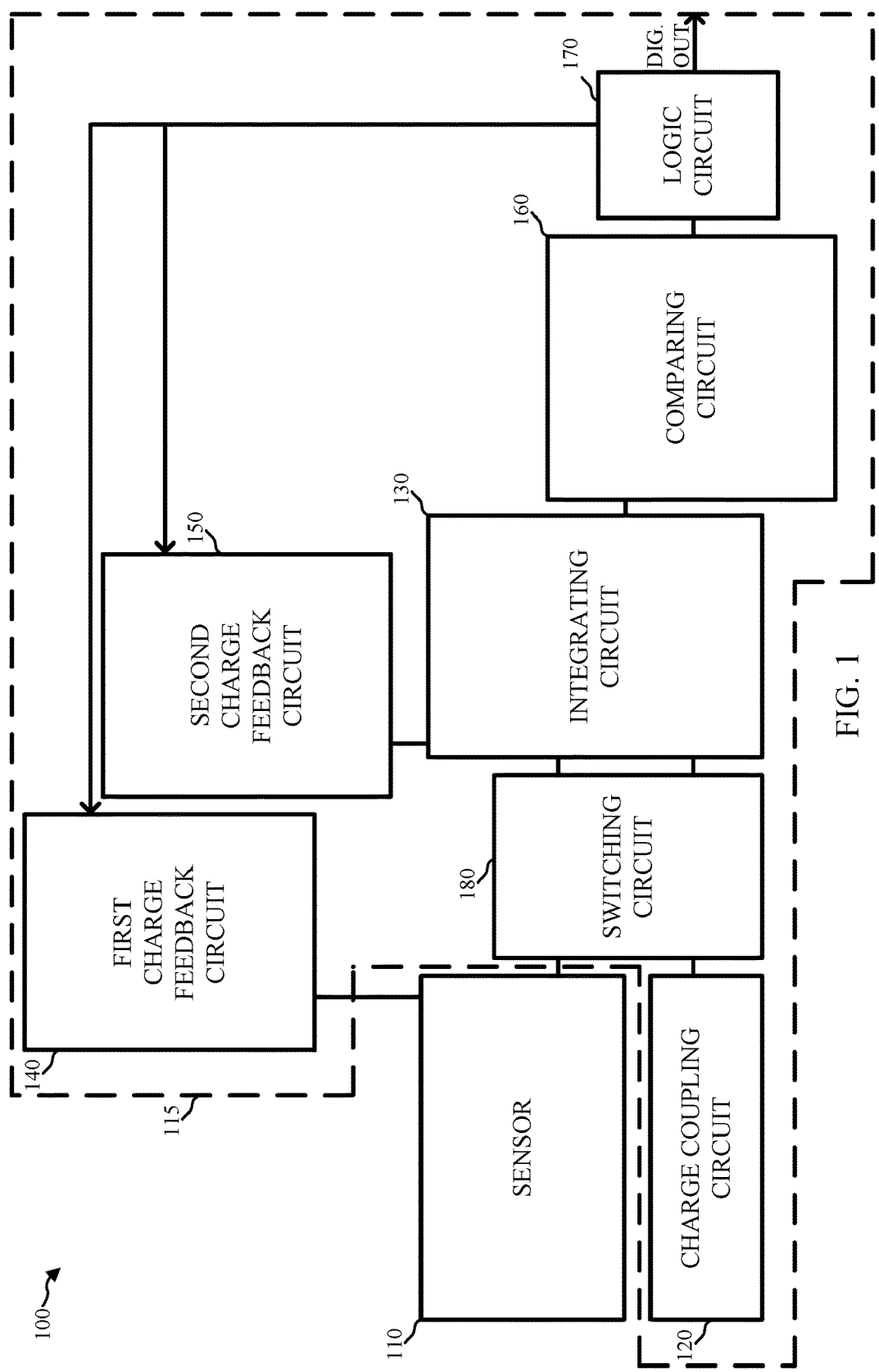
FIG. 1 is a block diagram of an apparatus including a sensor coupled to a converter, in accordance with aspects of the present disclosure.

Turning now to the figures, FIG. 1 illustrates an apparatus 100 that includes a sensor 110 coupled to a $\Delta\Sigma$ analog-to-digital converter 115. The sensor 110 may be any kind of sensing device, and may be configured to sense seismic quantities such as particle motion, pressure, and so forth. The sensor 110 may alternatively, however, sense non-seismic quantities. Certain embodiments of the sensor 110 may include a motion sensor, such as a capacitive or other piezoelectric sensing device. Other embodiments of the sensor 110 may include a hydrophone (e.g., a capacitive piezoelectric pressure sensor) or any type of high impedance (hi-Z), low capacitance (lo-C) sensing device. In some embodiments, the sensor 110 may include a transducer similar to that described in PCT Publication Number WO 2012/109259, the entirety of which is hereby incorporated by reference for all purposes.

As illustrated in FIG. 1, the $\Delta\Sigma$ converter 115 may include a charge coupling circuit 120, an integrating circuit 130, a first charge feedback circuit 140, a second charge feedback circuit 150, a comparing circuit 160, a logic circuit 170, and a switching circuit 180. The sensor 110 may, in some embodiments, be directly coupled to the $\Delta\Sigma$ converter 115 in a charge coupling mode, as shown and described in more detail below.

The charge coupling circuit 120 of the $\Delta\Sigma$ converter 115 may be configured to transfer at least a portion of the charge generated by the sensor 110 to an integrating circuit 130. A switching circuit 180 may be used for this purpose, with the switching circuit 180 selectively coupling the sensor 110 to the charge coupling circuit 120 to transfer charge from the sensor 110 to the charge coupling circuit 120. The switching circuit 180 may then selectively couple the charge coupling circuit 120 to the integrating circuit 130 for delivery of the sensor-generated charge to the integrating circuit 130. In some embodiments, the switching circuit 180 may include a discharging circuit (not shown in FIG. 1) that is configured to clear any charge accumulated in the charge coupling circuit prior to receiving and then delivering the portion of charge generated by the sensor to the integrating circuit 130.

The integrating circuit 130 of the $\Delta\Sigma$ converter 115 may be configured to accumulate (e.g., store) charge in proportion to a difference between the charge transferred from the sensor 110 to the integrating circuit 130 by the charge coupling circuit 120 and the charge fed back to the integrating circuit 130 by the second charge feedback circuit 150 (which is described in more detail below).

The first charge feedback circuit 140 of the ΔΣ converter 115 may be configured to feed back charge to the sensor 110. Similarly, the second charge feedback circuit 150 of the ΔΣ converter 115 may be configured to feed back charge to the integrating circuit 130. The amount and polarity of charge fed back by the first and second charge feedback charge circuits 140, 150 may be determined as described below, but in general the amount and polarity of charge fed back to the sensor 110 by the first charge feedback circuit 140 may be designed to be proportional and opposite to the sensor-generated charge. In some embodiments, the second charge feedback circuit 150 may feed back the same amount of charge as the first charge feedback circuit 140 in a single operational cycle, whereas in other embodiments, the first and second charge feedback circuits 140, 150 may feed back different, but proportional amounts of charge. By measuring the amount of charge that is fed back to the sensor 110 by the first charge feedback circuit and/or the amount of corresponding charge that is fed back to the integrating circuit 130 by the second charge feedback circuit 150, the amount of charge generated by the sensor 110 may be ascertained. In some examples, the feedback may be single bit (e.g., in the case that only the polarity of the charge is fed back to the integrating circuit 130).

The comparing circuit 160 of the ΔΣ converter 115 may be configured to detect accumulated charge at the integrating circuit 130 for a current operating cycle for use in determining a polarity of charge to feed back for a subsequent operational cycle. Because the first and second charge feedback circuits 140, 150 feed back charge in quantized packets, the amount of charge fed back to the sensor 110 may not exactly counteract or negate the charge generated by the sensor 110. However, using a delta modulation scheme based on the accumulated charge at the integrating circuit 130, the difference between the charge generated by the sensor and the charge fed back by the first and/or second charge feedback circuits 140, 150 for the current operational cycle can be ascertained and used to determine what polarity of charge should be fed back in the following operational cycle.

The logic circuit 170 of the ΔΣ converter 115 may be configured to provide a digital output DIG. OUT corresponding to quantity sensed by the sensor 110, and may also be configured to provide the polarity of charge feedback determined by the comparing circuit to (1) the first charge feedback circuit for controlling the charge fed back to the sensor and also to (2) the second charge feedback circuit for controlling the charge fed back to the integrating circuit. The density of logic high bits (e.g., 1s) and/or the density of logic low bits (e.g., 0s) in the digital output DIG. OUT may be proportional to the feedback charge to the sensor 110 that is required to counteract or negate the charge generated by the sensor 110. In other words, because packets of charge of the necessary polarity may be fed back at a constant rate of time, and the polarity of charge may be defined by the high or low bit representation of the digital output DIG. OUT, the density of logic high bits is proportional to the charge necessary to counteract the charge generated by the sensor 110.

Figure 2:
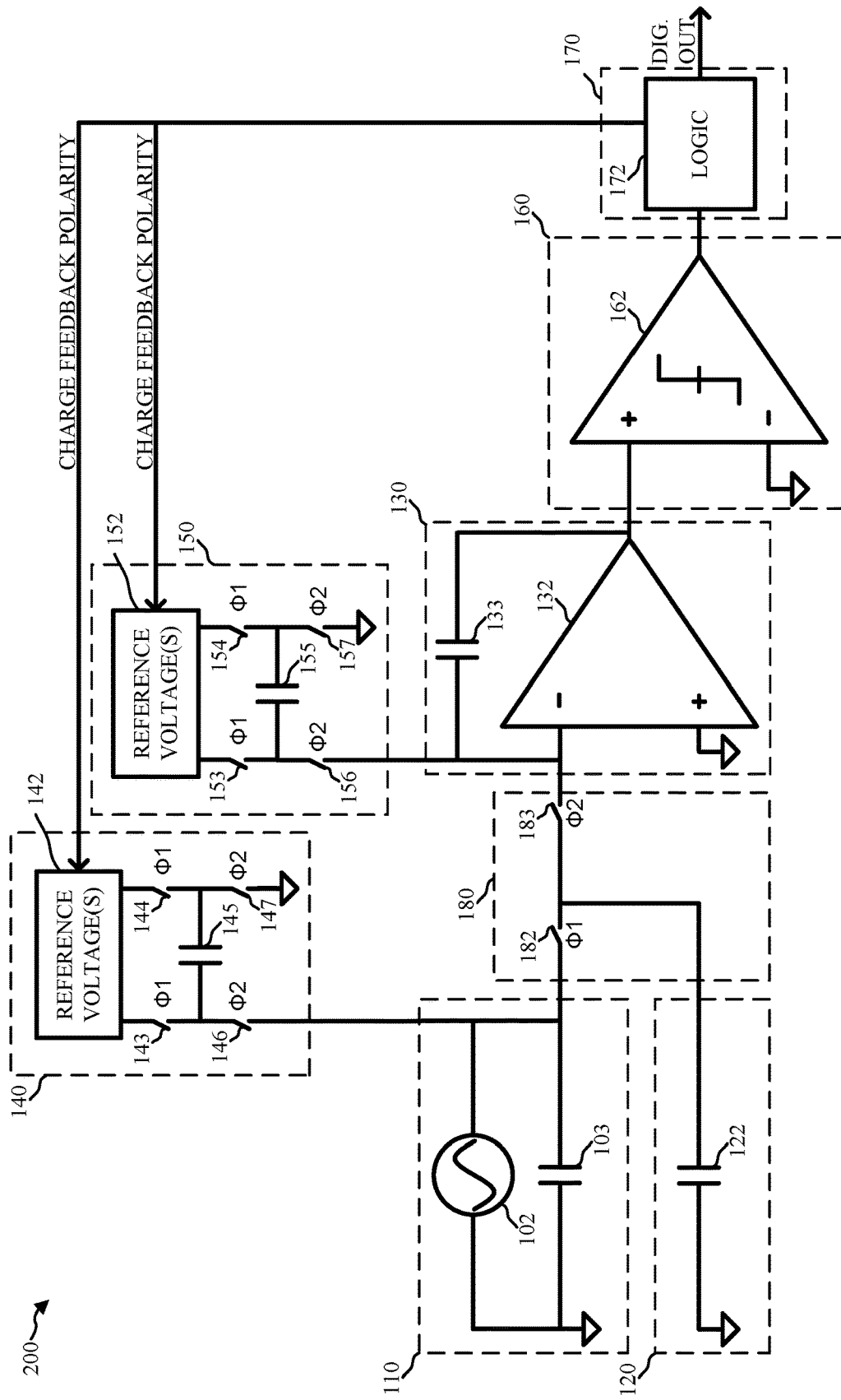
FIG. 2 is a circuit diagram of one embodiment of the apparatus of FIG. 1, in accordance with aspects of the present disclosure.

Turning now to FIG. 2, one embodiment 200 of the apparatus 100 of FIG. 1 will now be described. Similar to the apparatus 100 in FIG. 1, the embodiment 200 shown in FIG. 2 includes a sensor 110, a charge coupling circuit 120, an integrating circuit 130, first and second charge feedback circuits 140, 150, a comparing circuit 160, a logic circuit 170, and a switching circuit 180, each of which may be an example of one or more aspects of the corresponding elements in FIG. 1.

In the embodiment 200 of FIG. 2, the sensor 110 is shown as a current source 102 with a capacitor 103 in parallel with the current source 102. Alternatively, the sensor 110 may be considered to be a voltage source in series with a capacitor. In the arrangement shown in FIG. 2, the sensor 110 may act as a pseudo-integrator by accumulating the charge generated by the current source 102, although this accumulation will be offset by the charge fed back by the first charge feedback circuit 140.

The charge coupling circuit 120 in FIG. 2 includes a flying capacitor 122 coupled between ground and the switching circuit 180, which acts to alternatingly couple the flying capacitor 122 to the sensor 110 and to the integrating circuit 130 in different phases of each operational cycle, as described in more detail below.

The integrating circuit 130 in FIG. 2 includes an operational amplifier (or op-amp) 132 and a capacitor 133 coupled to the op-amp 132 in a charge-amplifier configuration. More specifically, as shown in FIG. 2, the capacitor 133 is coupled between the inverting input of the op-amp 132 and the output of the op-amp 132, and the positive input of the op-amp 132 is coupled to ground. In this charge amplifier configuration, the integrating circuit 130 is configured to accumulate charge at the inverting input node.

The first charge feedback circuit 140 in FIG. 2 may include a switched capacitor 145 configured to deliver a packet of charge to the sensor 110 (e.g., to the non-grounded output node of the current source 102 and capacitor 103) at each of a plurality of operating cycles based at least in part on the determined polarity of charge feedback for each of the plurality of operating cycles. Similarly, the second charge feedback circuit 150 may include a switched capacitor 155 configured to deliver a packet of charge to the integrating circuit 130 (e.g., to the inverting terminal of the op-amp 132) at each of the plurality of operating cycles based at least in part on the determined polarity of charge feedback. As mentioned above, the polarity of charge feedback determined by the comparing circuit 160 may act to negate charge generated by the sensor 110 via the first charge feedback circuit 140 and/or may act to minimize the charge that is accumulated at the sensor 110.

In addition to the switched capacitors 145, 155, the first and second charge feedback circuits 140, 150 each include a reference voltage(s) block 142, 152 that is configured to charge the respective switched capacitor 145, 155 to one or more reference voltages, with the polarity (and optionally the amount) of voltage being specified by the charge feedback polarity provided by the logic circuit 170. The first and second charge feedback circuits 140, 150 each also include one set of switches 143, 144, 153, 154 that couple the respective reference voltage(s) block 142, 152 to the respective switched capacitor 145, 155 during a first phase Φ1 of each operational cycle to charge the switched capacitor 145, 155 to the appropriate reference voltage. The first and second charge feedback circuits 140, 150 each also include a second set of switches 146, 147, 156, 157 that couple the respective switched capacitor 145, 155 to either the sensor 110 (for the first charge feedback circuit 140) or the integrating circuit 130 (for the second charge feedback circuit 150) during a second phase Φ2 of each operational cycle. In this manner, during the first phase Φ1 of each operational cycle, the switched capacitors 145, 155 are charged to the appropriate reference voltage by the reference voltage blocks 142, 152, and then during the second phase Φ2 of each operational cycle, the switched capacitors 145, 155 deliver a respective packet of charge to either the sensor 110 (for the first charge feedback circuit 140) or the integrating circuit 130 (for the second charge feedback circuit 150).

The comparing circuit 160 in FIG. 2 includes a comparator 162, with one input coupled to the output of the op-amp 132 of the integrating circuit 130 and the other input coupled to ground. In this configuration, the comparator 162 determines whether the charge accumulated at the output of the op-amp 132 is positive or negative, and provides this polarity information to the logic circuit 170 for use in generating the digital output DIG. OUT and also for generating the polarity of charge feedback for the first and second charge feedback circuits 140, 150.

The logic circuit 170 includes a logic block 172, which receives the output of the comparator 162 of the comparing circuit 160 (which represents the polarity of the charge accumulated at the output of the op-amp 132), and in response thereto, generates the digital output DIG. OUT and also generates the charge feedback polarity for use by the first and second charge feedback circuits 140, 150. As previously mentioned, the density of logic high bits (e.g., 1s) and/or the density of the logic low bits (e.g., 0s) in the digital output DIG. OUT may be proportional to the positive and/or the negative charge feedback packets that are required to counteract or negate the charge generated by the sensor 110.

The switching circuit 180 in FIG. 2 includes a first switch 182 and a second switch 183. During the first phase Φ1 of each operational cycle, the first switch 182 is closed and the second switch 183 is open. This action of the switching circuit 180 acts to couple the sensor 110 to the charge coupling circuit 120, thereby transferring at least a portion of the charge generated by and accumulated at the sensor 110 to the capacitor 122 of the charge coupling circuit 120. During the second phase Φ2 of each operational cycle, the first switch 182 is open and the second switch 183 is closed. This action of the switching circuit 180 acts to couple the charge coupling circuit 120 to the integrating circuit 130, thereby transferring at least a portion of the charge on the capacitor 122 of the charge coupling circuit 120 to the integrating circuit 130. In this manner, the switching circuit 180 alternatingly couples the charge coupling circuit 120 to the sensor 110 and the integrating circuit 130 in order to transfer charge from the sensor 110 to the charge coupling circuit 120 and then to the integrating circuit 130.

Figure 3:
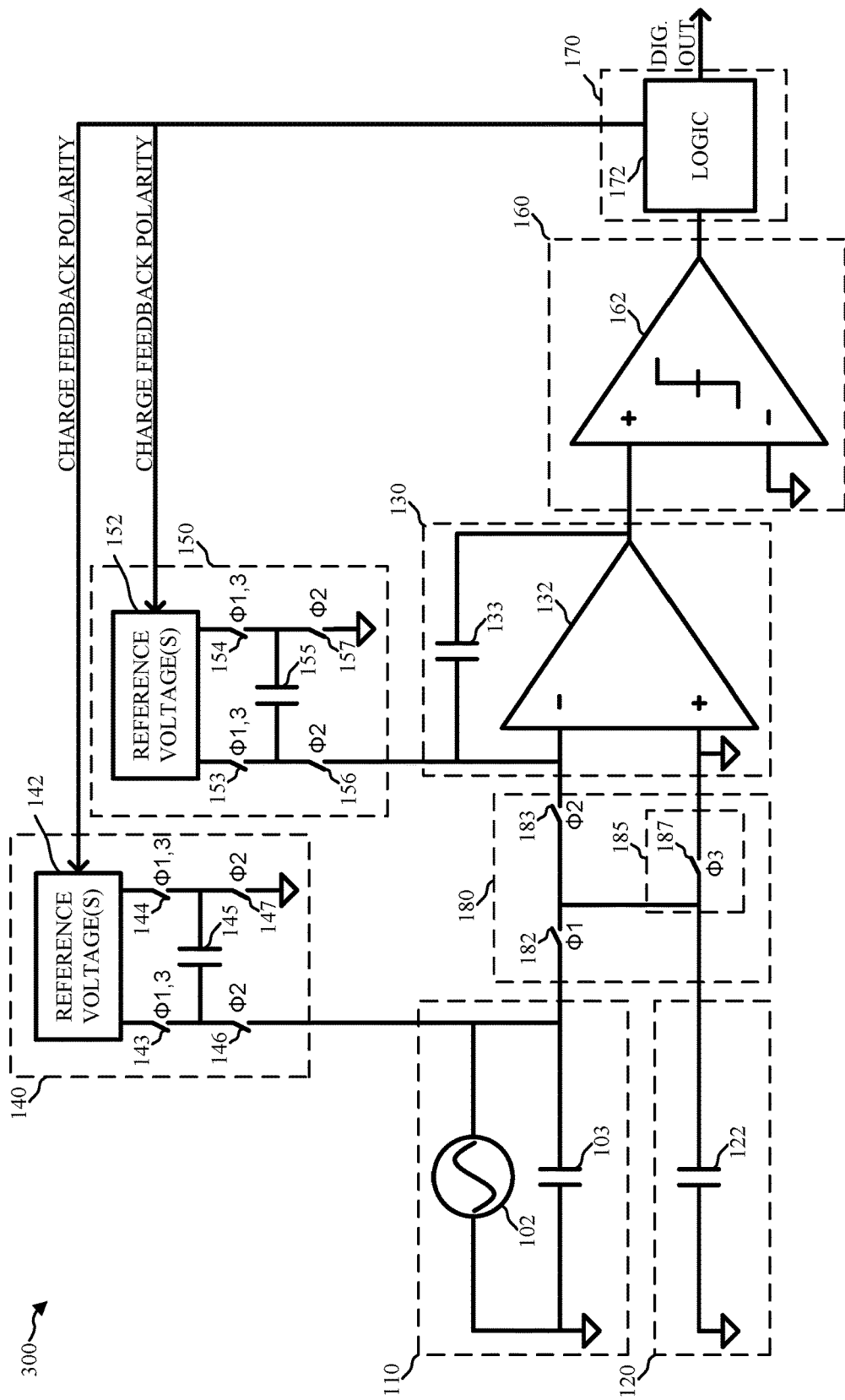
FIG. 3 is a circuit diagram of another embodiment of the apparatus of FIG. 1, in accordance with aspects of the present disclosure.

FIG. 3 is a circuit diagram of another embodiment 300 of the apparatus of FIG. 1, which is similar in some aspects to the embodiment 200 shown in FIG. 2. Unlike the embodiment 200 shown in FIG. 2, though, the switching circuit 180 of the embodiment 300 shown in FIG. 3 includes a discharging circuit 185, which may be configured to clear any charge accumulated in the charge coupling circuit 120 (e.g., on the flying capacitor 122) prior to receiving the charge generated by the sensor 110 and then delivering this charge to the integrating circuit 130. One possible source of such charge may be the noise current intrinsic to the op-amp 132 input. As shown in FIG. 3, the discharging circuit 185 may include a switch 187, which is closed during a third phase Φ3 of each operational cycle, and open during the first and second phases Φ1, Φ2 of each operational cycle, as described more fully below with reference to FIGS. 4A-4C. Also, in FIG. 3, the first set of switches 143, 144, 153, 154 in the first and second charge feedback circuits 140, 150 are configured to be closed during the third phase Φ3 of each operational cycle, which is also described in more detail below.

It will also be appreciated that while FIGS. 2 and 3 have shown two different embodiments 200, 300 of the apparatus 100 of FIG. 1 including a sensor 110 and a ΔΣ converter 115, many other variations are also contemplated. For example, one or more additional integrating circuits (similar to the integrating circuit 130 in FIGS. 2 and 3) may be included, together with one or more corresponding charge feedback circuits (similar to the charge feedback circuits 140, 150 in FIGS. 2 and 3) in order to increase the delta-sigma order of the overall apparatus. In such higher order sensor-converter apparatuses, a greater level of quantization may be employed, which may improve the accuracy of the digital output DIG. OUT. As another example, instead of the charge feedback polarity being used by the reference voltage blocks 142, 152 to determine to which reference voltage (e.g., positive or negative) the switched capacitors 145, 155 should be charged, the switched capacitors 145, 155 may always be charged to the same reference voltage, and the charge feedback polarity signal may be used to drive switches that determine the polarity of how the switched capacitors 145, 155 provide their feedback charge to the sensor 110 and the integrating circuit 130.

Figure 4A:
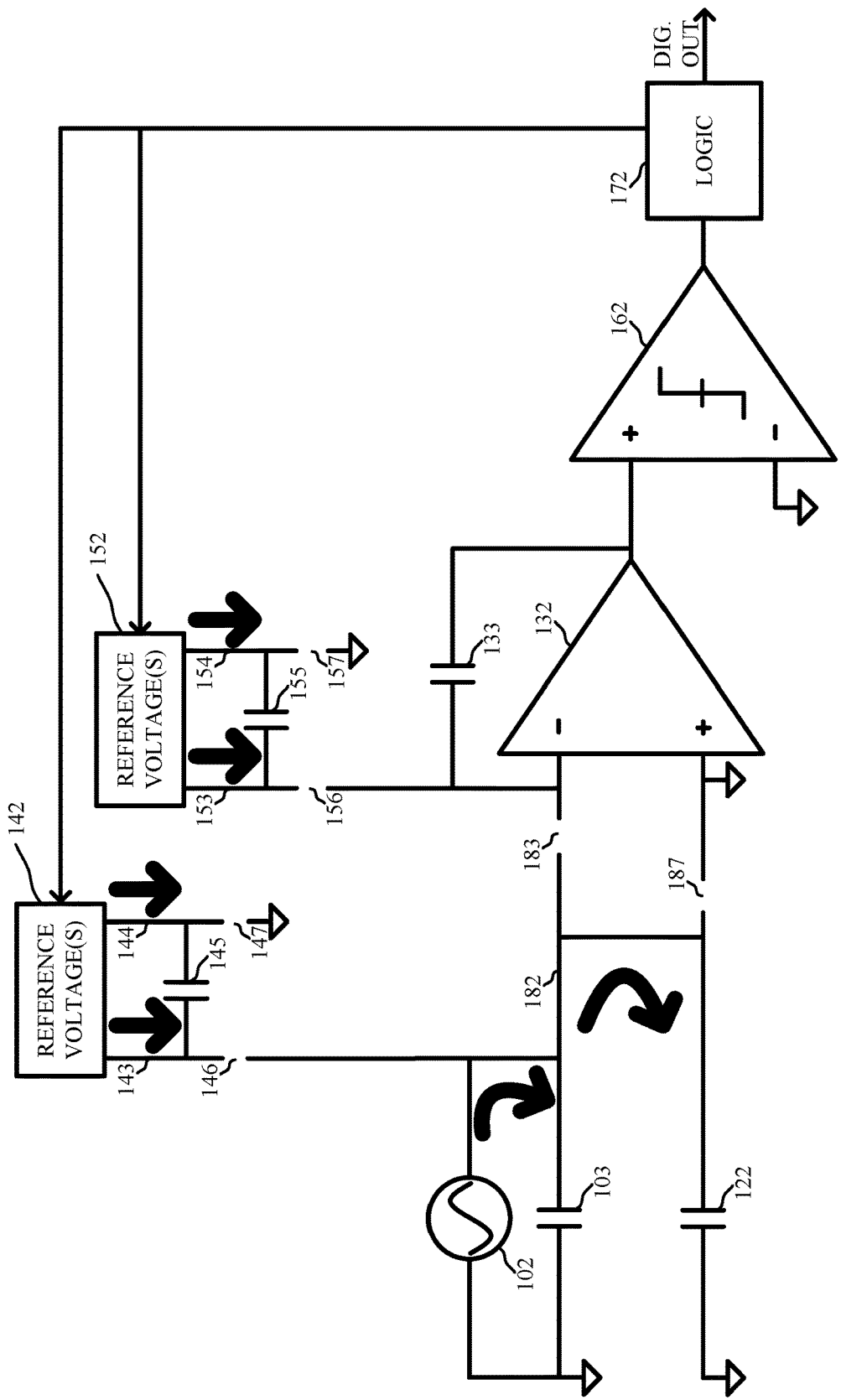
FIGS. 4A-4C are circuit diagrams showing the operation of the embodiment of FIG. 3, in accordance with aspects of the present disclosure.
Figure 4B:
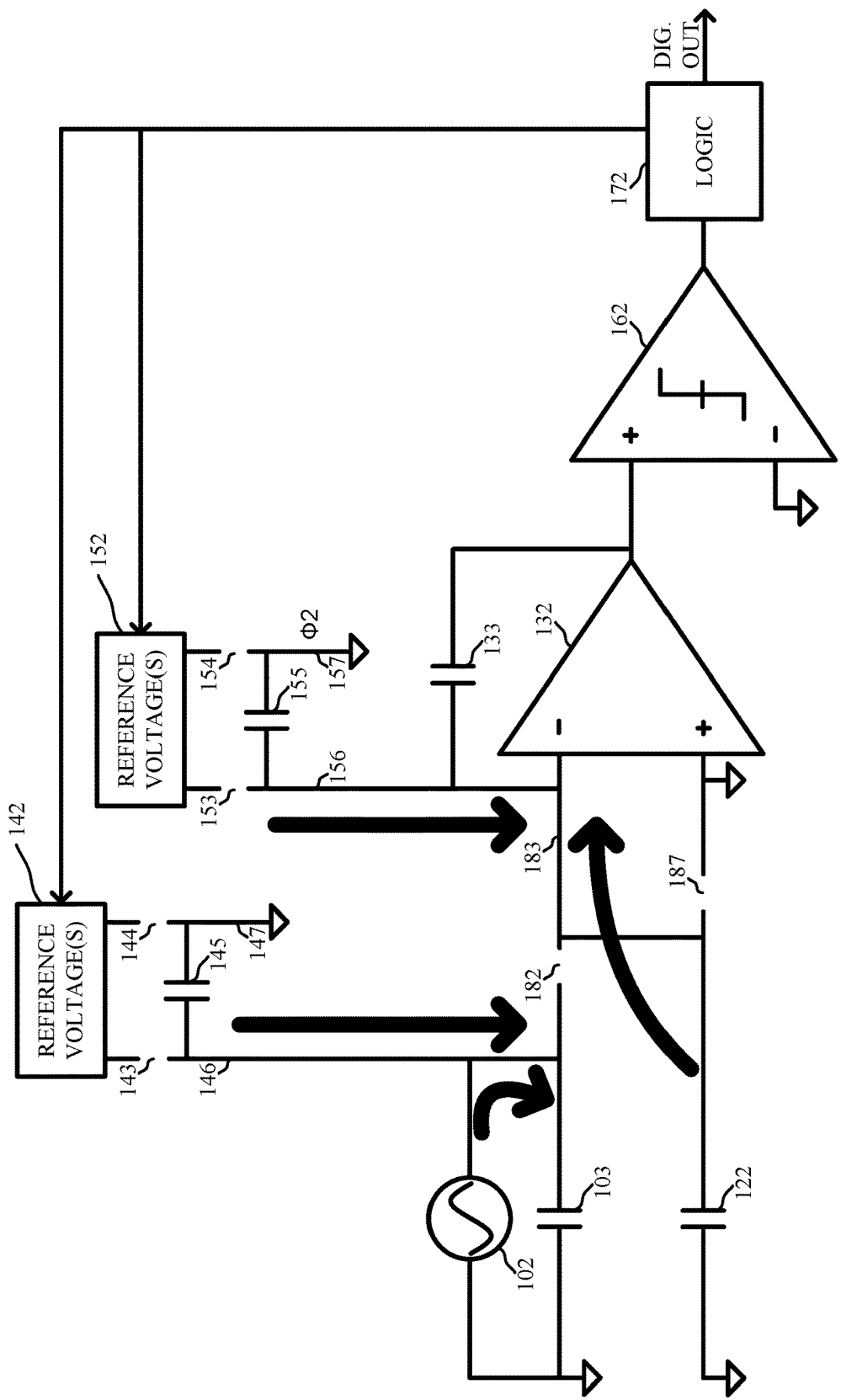
Figure 4C:
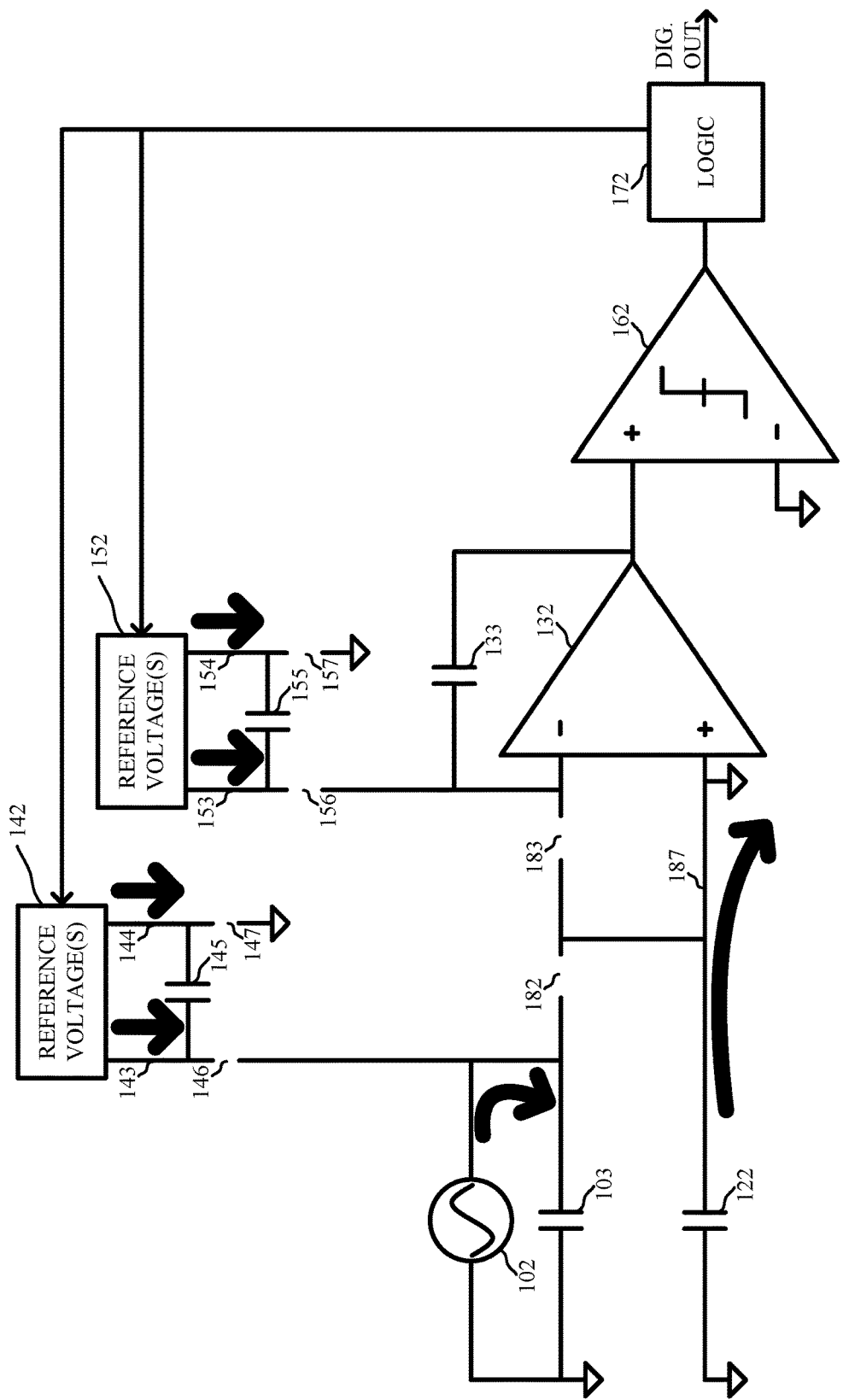

Turning now to FIGS. 4A-4C, the operation of the embodiment 300 shown in FIG. 3 will now be described. It will be appreciated that the operation of the embodiment 200 shown in FIG. 2 is similar, except that no third phase (Φ3) is needed to use the discharging circuit 185. Furthermore, the dashed lines representing some of the elements of the embodiment 300 have been omitted in FIGS. 4A-4C for clarity.

FIGS. 4A-4C each show the operation of the embodiment 300 shown in FIG. 3 with respect to the three phases Φ1, Φ2, Φ3 of each operational cycle. Each operational cycle may be divided into these three phases in order to accommodate the switched feedback structure described above. Each operational cycle corresponds to one sample of the sensor 110 and one corresponding output from the logic block 172—in other words, one sample is produced each time the embodiment 300 proceeds through all three phases Φ1, Φ2, Φ3. In some embodiments, the sampling rate (i.e., the number of operational cycles per second) may be higher than the highest frequency of interest. For example, the sampling rate or number of operational cycles per second may be at least three times higher than the highest frequency of interest in the underlying quantity being sensed in order to spread any capacitor reset noise across a large spectrum, which in turn may result in a satisfactorily low noise energy density in the spectrum of interest for the sensed quantity. In other words, the analog quantity sensed by the sensor 110 may be oversampled in order to spread the quantization noise over a relatively wide band in order to reduce the noise density in the frequency band of interest.

With reference first to the first phase Φ1 of each operational cycle, the embodiment 300 in FIG. 3 may operate as depicted in FIG. 4A. In FIG. 4A, switches 143, 144, 153, 154, and 182 are closed, while switches 146, 147, 156, 157, 183, and 187 are open. In this configuration, at least a portion of the charge accumulated on the capacitor 103 (including any charge left over from the previous operational cycle and new charge generated by the sensor) is transferred to the flying capacitor 122, with the charge on the capacitor 122 having been cleared in the third phase Φ3 of a previous operational cycle. In some examples, the duration of the first phase Φ1 may be sufficiently long enough that switching transients for the capacitors 103, 122 can settle, such that at the conclusion of the first phase Φ1, the capacitor 122 contains a sample of the charge generated by the sensor for that operational cycle and any charge remaining from previous operational cycles. The current source 102 of the sensor also continues to generate charge, which partially accumulates on the capacitor 103 and is partially transferred to the flying capacitor 122. In any event, the charge on the flying capacitor 122 at the conclusion of the first phase Φ1 is representative of and proportional to the charge generated by the sensor and charge leftover from previous operating cycles, with the proportion being determined by the respective values of the capacitors 103, 122.

Also during the first phase Φ1, the reference voltage blocks 142, 152 charge the respective switched capacitors 145, 155 to a reference voltage, with the polarity (and optionally the amount) of the reference voltage being determined by the integrating and comparing circuits from a previous operational cycle. As before, the duration of the first phase Φ1 may be long enough for switching transients in the switching capacitors 145, 155 to settle, such that at the conclusion of the first phase Φ1, the switching capacitors 145, 155 are loaded and ready for delivery of the feedback charge to the sensor and integrating circuit, respectively. Also during the first phase Φ1, the integrating circuit and comparing circuit hold their previous values from the end of the third phase Φ3 of the previous operational cycle.

With reference next to the second phase Φ2 of each operational cycle, the embodiment 300 in FIG. 3 may operate as depicted in FIG. 4B. In FIG. 4B, switches 146, 147, 156, 157, and 183 are closed, while switches 143, 144, 153, 154, 182, and 187 are open. In this configuration, the charge transferred from the sensor to the charge coupling circuit is at least partially transferred to the integrating circuit (more specifically to the inverting input node of the op-amp 132). Additionally, the charge on the switched capacitor 145 of the first charge feedback circuit is transferred to the sensor (while the sensor continues to generate charge as shown in FIG. 4B), and the charge on the switched capacitor 155 of the second charge feedback circuit is also transferred to the integrating circuit (more specifically to the inverting input node of the op-amp 132).

Because the positive input of the op-amp 132 is held at ground, the inverting input remains at virtual ground, causing all of the charge from both the capacitor 122 of the charge coupling circuit and the switched capacitor 155 of the second charge feedback circuit to accumulate at the capacitor 133 of the integrating circuit, together with any charge already present at that node from previous operating cycles. In this manner, the integrating circuit adds the difference in charge between that delivered from the sensor and that fed back by the second charge feedback circuit to the charge already stored at the integrating circuit, and uses the sum (or difference) of these charges to determine the feedback charge polarity for a subsequent operational cycle.

Because this accumulation of charge includes not only the new charge from the sensor and the feedback charge but also any charge left over from the previous operational cycle, the quantization error from previous operational cycles is accounted for, which may help prevent the quantum error from building up and thus may allow the average quantization error to be small over long periods. Still with reference to FIG. 4B, at the conclusion of the second phase Φ2, the logic block 172 uses the polarity of the net or total accumulated charge on the capacitor 133 of the integrating circuit for the current operational cycle to select the polarity of charge feedback for the subsequent operational cycle. This is done with the intent of feeding back charge in that subsequent operational cycle that is opposite to the accumulated charge on the capacitor 133.

With reference lastly to the third phase Φ3 of each operational cycle, the embodiment 300 in FIG. 3 may operate as depicted in FIG. 4C. In FIG. 4C, switches 143, 144, 153, 154, and 187 are closed, while switches 146, 147, 156, 157, 182, and 183 are open. In this configuration, the sensor continues to generate charge in proportion to the sensed quantity, and the reference voltage blocks 142, 152 charge their respective switched capacitors 145, 155 similar to the operation in the first phase Φ1 described above. Also in phase Φ3, any charge on the capacitor 122 of the charge coupling circuit is cleared as a result of the switch 187 of the discharging circuit coupling the capacitor 122 to ground. In this manner, the capacitor 122 of the charge coupling circuit is cleared and ready to receive charge from the sensor in the subsequent operational cycle.

Referring now to FIGS. 4A-4C, it will be appreciated that each operational cycle corresponds with one digital output DIG. OUT sample of the quantity sensed by the sensor. In other words, the rate of the digital output DIG. OUT is one sample per each group of first, second, and third phases Φ1, Φ2, Φ3 of a single operational cycle. Also, with respect to the various switches 143, 144, 146, 147, 153, 154, 156, 157, 182, 183, 187, it will be appreciated that the switches may be break-before-make with reference to the different phases, such that the switches that will be open for a particular phase actually open before the switches that will be closed for that particular phase actually close.

Referring now to FIGS. 1-4C, while various apparatuses and circuits and their operation have been described, it will be appreciated that the present disclosure also contemplates corresponding methods of manufacturing and using such apparatuses and circuits.

In methodologies directly or indirectly set forth herein, various steps and operations are described in one possible order of operation, but those skilled in the art will recognize that the steps and operations may be rearranged, replaced, or eliminated without necessarily departing from the spirit and scope of the disclosed embodiments. Further, all relative and directional references used herein are given by way of example to aid the reader's understanding of the particular embodiments described herein. They should not be read to be requirements or limitations, particularly as to the position, orientation, or use of the invention unless specifically set forth in the claims.

Furthermore, in various embodiments, the invention provides numerous advantages over the prior art. However, although embodiments of the invention may achieve advantages over other possible solutions and/or over the prior art, whether or not a particular advantage is achieved by a given embodiment is not limiting of the invention. Thus, the described aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

What is claimed is:

1. An apparatus, comprising:
    a sensor configured to generate charge in proportion to a sensed quantity;
    a charge coupling circuit configured to transfer at least a portion of the charge generated by the sensor to an integrating circuit;
    a first charge feedback circuit configured to feed back charge to the sensor;

a second charge feedback circuit configured to feed back charge to the integrating circuit, the integrating circuit being configured to accumulate charge in proportion to a difference between the charge transferred from the sensor to the integrating circuit by the charge coupling circuit and the charge fed back to the integrating circuit by the second charge feedback circuit;

a comparing circuit configured to detect accumulated charge at the integrating circuit for a current cycle to determine a polarity of charge feedback for a subsequent cycle; and a logic circuit configured to provide at least one of a digital output corresponding to the sensed quantity and the polarity of charge feedback determined by the comparing circuit to the first charge feedback circuit for controlling the charge fed back to the sensor and also to the second charge feedback circuit for controlling the charge fed back to the integrating circuit.

2. The apparatus of claim 1, wherein the logic circuit is configured to use a single bit to provide the digital output corresponding to the sensed quantity or the polarity of charge feedback determined by the comparing circuit.

3. The apparatus of claim 1, further comprising a switching circuit configured to selectively couple the sensor to the charge coupling circuit and also configured to selectively couple the charge coupling circuit to the integrating circuit.

4. The apparatus of claim 3, wherein the switching circuit comprises a discharging circuit configured to clear any charge accumulated in the charge coupling circuit prior to transferring said portion of charge generated by the sensor to the integrating circuit.

5. The apparatus of claim 1, wherein the first charge feedback circuit comprises a switched capacitor configured to deliver a packet of charge to the sensor at each of a plurality of operating cycles based at least in part on the determined polarity of charge feedback for each of the plurality of operating cycles.

6. The apparatus of claim 5, wherein the polarity of charge feedback determined by the comparing circuit acts to counteract or negate the charge generated by the sensor via the first charge feedback circuit.

7. The apparatus of claim 6, wherein the polarity of charge feedback determined by the comparing circuit acts to minimize charge accumulated at the sensor.

8. The apparatus of claim 1, wherein the sensor is configured to act as a pseudo-integrator by accumulating the charge generated by the sensor offset by the charge fed back by the first charge feedback circuit.

9. The apparatus of claim 1, wherein the charge coupling circuit comprises a flying capacitor coupled to ground.

10. The apparatus of claim 1, wherein the integrating circuit comprises an operational amplifier and a capacitor in a charge amplifier configuration.

11. The apparatus of claim 1, wherein the sensor comprises a capacitive piezoelectric motion sensor.

12. The apparatus of claim 1, wherein the sensor is configured to sense seismic quantities.

13. The apparatus of claim 1, wherein the sensor comprises a capacitive piezoelectric pressure sensor.

14. The apparatus of claim 1, wherein the sensor comprises any type of hi-Z, lo-C sensing device.

15. The apparatus of claim 1, further comprising one or more additional integrating circuits and one or more corresponding charge feedback circuits, which together increase a delta-sigma order of the apparatus.

16. The apparatus of claim 1, wherein a density of logic high bits in the digital output is proportional to the feedback charge to the sensor that is required to counteract or negate the charge generated by the sensor.

17. A method, comprising:
generating charge at a sensor in proportion to a sensed quantity;
transferring at least a portion of the charge generated by the sensor to an integrating circuit via a charge coupling circuit;
feeding back charge to the sensor via a first charge feedback circuit;
feeding back charge to the integrating circuit via a second charge feedback circuit,
accumulating charge at the integrating circuit in proportion to a difference between the charge transferred from the sensor to the integrating circuit by the charge coupling circuit and the charge fed back to the integrating circuit by the second charge feedback circuit;
detecting accumulated charge at the integrating circuit, via a comparing circuit, for a current cycle to determine a polarity of charge feedback for a subsequent cycle; and
providing at least one of a digital output corresponding to the sensed quantity and the polarity of charge feedback determined by the comparing circuit to the first charge feedback circuit for controlling the charge fed back to the sensor and also to the second charge feedback circuit for controlling the charge fed back to the integrating circuit.

18. The method of claim 17, wherein a single bit is used to provide the digital output corresponding to the sensed quantity or the polarity of charge feedback determined by the comparing circuit.

19. The method of claim 17, further comprising:
selectively coupling the sensor to the charge coupling circuit; and
selectively coupling the charge coupling circuit to the integrating circuit.

20. The method of claim 19, further comprising:
clearing any charge accumulated in the charge coupling circuit, via a discharging circuit, prior to transferring said portion of charge generated by the sensor to the integrating circuit.

21. The method of claim 17, further comprising:
increasing a delta-sigma order of the apparatus using one or more additional integrating circuits and one or more corresponding charge feedback circuits.

22. An apparatus, comprising:
sensing means for generating charge in proportion to a sensed quantity;
charge coupling means for transferring at least a portion of the charge generated by the sensor to an integrator;
first charge feedback means for feeding back charge to the sensor;
second charge feedback means for feeding back charge to the integrator, the integrator comprising integrating means for accumulating charge in proportion to a difference between the charge transferred from the sensing means to the integrator by the charge coupling means and the charge fed back to the integrator by the second charge feedback means;
comparing means for detecting accumulated charge at the integrating means for a current cycle to determine a polarity of charge feedback for a subsequent cycle; and
logic means for providing at least one of a digital output corresponding to the sensed quantity and the polarity of charge feedback determined by the comparing means to the first charge feedback means for controlling the charge fed back to the sensor and also to the second charge feedback means for controlling the charge fed back to the integrator.

\* \* \* \* \*